United States Patent
Park et al.

(10) Patent No.: US 6,757,851 B1
(45) Date of Patent: Jun. 29, 2004

(54) ERROR CONTROL METHOD FOR VIDEO BITSTREAM DATA USED IN WIRELESS COMMUNICATION AND COMPUTER PROGRAM PRODUCT THEREFOR

(75) Inventors: Jeong-hoon Park, Suwon (KR); Dong-seek Park, Suwon (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 533 days.

(21) Appl. No.: 09/677,190

(22) Filed: Oct. 2, 2000

(30) Foreign Application Priority Data

Oct. 2, 1999 (KP) ............................................. 99-42498

(51) Int. Cl.[7] ................................................ G06F 11/08
(52) U.S. Cl. ......................... 714/48; 714/758; 714/701
(58) Field of Search ............................. 714/48, 4, 701, 714/699, 758, 18; 709/231

(56) References Cited

U.S. PATENT DOCUMENTS

| | | | | |
|---|---|---|---|---|
| 4,145,683 A | * | 3/1979 | Brookhart | 714/758 |
| 5,951,707 A | | 9/1999 | Christensen et al. | |
| 5,991,912 A | * | 11/1999 | Mao | 714/776 |
| 6,115,370 A | * | 9/2000 | Struhsaker et al. | 370/342 |
| 6,182,261 B1 | * | 1/2001 | Haller et al. | 714/758 |
| 6,226,769 B1 | * | 5/2001 | Schuster et al. | 714/752 |
| 6,317,462 B1 | * | 11/2001 | Boyce | 375/240.27 |
| 6,351,456 B1 | * | 2/2002 | Struhsaker et al. | 370/280 |
| 6,357,029 B1 | * | 3/2002 | Sinha et al. | 714/752 |
| 6,363,412 B1 | * | 3/2002 | Niwa et al. | 709/203 |
| 6,412,092 B1 | * | 6/2002 | Raghunath | 714/807 |
| 6,425,106 B1 | * | 7/2002 | Higginson et al. | 714/759 |
| 6,445,717 B1 | * | 9/2002 | Gibson et al. | 370/473 |
| 6,466,832 B1 | * | 10/2002 | Zuqert et al. | 700/94 |
| 6,487,690 B1 | * | 11/2002 | Schuster et al. | 714/752 |
| 6,490,705 B1 | * | 12/2002 | Boyce | 714/776 |
| 6,502,139 B1 | * | 12/2002 | Birk et al. | 709/233 |
| 6,512,751 B1 | * | 1/2003 | Struhsaker et al. | 370/329 |
| 6,553,038 B1 | * | 4/2003 | Fukuda | 370/465 |
| 6,560,496 B1 | * | 5/2003 | Michener | 700/94 |
| 6,574,218 B1 | * | 6/2003 | Cooklev | 370/352 |
| 6,622,171 B2 | * | 9/2003 | Gupta et al. | 709/231 |
| 6,628,641 B1 | * | 9/2003 | Strawczynski et al. | 370/349 |

OTHER PUBLICATIONS

Wu, D.; Hou, Y.; Zhu, W.; Zhang Y.; Choa, J., MPEG–4 Compressed Video Over the Internet, 1999, IEEE pp.IV–327–331.*

Advanced Television Systems Committee, Digital Audio Compression Standard (AC–3), Doc. A/52, Dec. 20, 1995, pp. 93–97.*

Abstract No. WO 98/82285, dated Nov. 19, 1998.

* cited by examiner

*Primary Examiner*—Scott Baderman
*Assistant Examiner*—Anne L Damiano
(74) *Attorney, Agent, or Firm*—Sughrue Mion, PLLC

(57) ABSTRACT

A method and computer program product for performing error control of video bitstream data encoded according to a data partition technique used in communication through a wireless channel. The method includes the steps of (a) partitioning video bitstream data into units of information items having certain characteristics and encoding the video bitstream data, (b) calculating a checksum for controlling errors in each partitioned unit of the encoded video bitstream data, (c) constituting a packet, in which each checksum calculated in a the step (b) is added to the encoded video bitstream data and transmitting the packet through a wireless communication channel, and (d) receiving the packet transmitted in the step (c) and checking whether there is an error in each partitioned unit of the encoded video bitstream data through the checksum of each partitioned unit of the encoded video bitstream data. According to the above method, it is possible to effectively detect the errors of the respective partitioned video bitstream data items and to use partial data without abandoning the entire video bitstream packet when errors occur in a specific portion of the video bitstream data by calculating the CRCs of the respective partition regions of the video bitstream data encoded according to a data partition technique.

14 Claims, 2 Drawing Sheets

ERROR CONTROL METHOD FOR VIDEO BITSTREAM DATA USED IN WIRELESS COMMUNICATION AND COMPUTER PROGRAM PRODUCT THEREFOR

BACKGROUND OF THE INVENTION

1. Field of the Invention

The present invention relates to an error control method for video bitstream data, and more particularly, to an error control method for video bitstream data encoded according to a data partition technique used in multimedia communication through a wireless channel. This application is based on Korean Patent Application No. 99-42498, filed Oct. 2, 1999, which is incorporated herein by reference.

2. Description of the Related Art

When wire communication media is used for the communication of multimedia data such as video bitstream data, a transmission error rate is very low due to the stability of communication media. However, the transmission error rate in wireless communication is higher than the transmission error rate in wire communication, due to the characteristics of the wireless media. Therefore, controlling errors for securing the reliability of transmission data is very important in wireless multimedia communication. Therefore, the conventional international telecommunication union, telecommunication standardization sector (ITU-T) H.223, is designed in consideration of error resilience in multiplexing various multimedia data. However, in the conventional ITU-T H.223, additional error resilience for the video bitstream data is not considered.

FIG. 1 schematically shows a multiplexing method for packetizing the video bitstream data in the conventional H.223.

As shown in FIG. 1, in the conventional technology, the H.223 adaptation layer-2 (AL-2) is constituted of a portion in which a header 11 is inserted into a video bitstream 10a received from a video codec and a portion in which a cyclic redundancy code (CRC) 12 of 16 bits is added to the video bitstream 10a in order to multiplex and constitute a transmission packet when receiving video bitstream data 10 from a video codec for H.324M such as H.263 or MPEG-4.

Here, the header 11 includes information on the total length of the video bitstream data, a packet number, and information items used for protecting the header. The CRC 12, which is a checksum used for determining an error in the packet, is calculated by performing a polynomial operation on the entire input video bitstream.

The packet constituted in the conventional H.223 AL-2 according to the above method is transmitted to a destination through communication media, and it is checked whether the CRC value of the received packet coincides with the CRC of the transmitted data when the received packet is demultiplexed at the destination. When there is no CRC error, the entire video bitstream data is used for decoding. When there is a CRC error, the entire video bitstream data is not used for decoding and the entire packet is abandoned.

Therefore, according to the conventional method, deterioration of picture quality due to packet loss increases when a communication channel, in which errors occur, such as the wireless channel is used. In particular, in the case of the video bitstream encoded using the data partition technique, even data on a specific partition region in which errors do not occur cannot be used.

SUMMARY OF THE INVENTION

In order to solve the above problems, it is an object of the present invention to provide an effective error control method for video bitstream data in wireless multimedia communication, in which a cyclic redundancy code (CRC) is added to each partition region of video bitstream data encoded according to a data partition technique.

It is another object of the present invention to provide a computer program product for the above error control method.

To achieve the first object, according to an aspect of the present invention, there is provided an error control method for video bitstream data used in wireless multimedia communication, comprising the steps of (a) partitioning video bitstream data into units of information items having certain characteristics and encoding the video bitstream data, (b) calculating a checksum for controlling errors in each partitioned unit of the encoded video bitstream data, (c) constituting a packet, in which each checksum calculated in the step (b) is added to the encoded video bitstream data and transmitting the packet through a wireless communication channel, and (d) receiving the packet transmitted in the step (c) and checking whether there is an error in each partitioned unit of the encoded video bitstream data through the checksum of each partitioned unit of the encoded video bitstream data.

According to another aspect of the present invention, there is provided an error control method of video bitstream data in wireless multimedia communication using a packet constituted by adding a checksum for controlling errors to each partitioned unit of video bitstream data, which is partitioned into units of information items having certain characteristics and encoded, comprising the steps of (a) receiving the packet and (b) checking whether errors exist in each partitioned unit of the encoded video bitstream data through the checksum of each partitioned unit of the encoded video bitstream data.

According to another aspect of the present invention, there is provided a method for constituting a packet for controlling errors of a video bitstream data used in wireless multimedia communication, comprising the steps of (a) receiving video bitstream data, which is partitioned into units of information items having certain characteristics and encoded, (b) calculating a checksum for controlling errors in each partitioned unit of the encoded video bitstream data, and (c) constituting a packet by adding each checksum calculated in the step (b) to the encoded video bitstream data.

To achieve the second object, according to an aspect of the present invention, there is provided computer program product, in which programs for executing the steps of (a) receiving video bitstream data, which is partitioned into units of information items having certain characteristics and encoded, and calculating a checksum for controlling errors in each partitioned unit of the encoded video bitstream data and (b) constituting a packet by adding each checksum calculated in the step (a) to the encoded video bitstream data, by computers, are recorded.

According to another aspect of the present invention, there is provided computer program product, in which programs for executing the steps of (a) receiving the packet and (b) checking whether there are errors in each partitioned unit of the encoded video bitstream data through the checksum of each partitioned unit of the encoded video bitstream data, by computers, are recorded in order to control errors of video bitstream data using a packet constituted by adding a checksum for controlling errors to each partitioned unit of video bitstream data, which is partitioned into units of information items having certain characteristics and encoded.

According to another aspect of the present invention, there is provided computer program product, in which programs for executing the steps of (a) receiving video bitstream data, which is partitioned into units of information items having certain characteristics and encoded, and calculating a checksum for controlling errors in each partitioned unit of the encoded video bitstream data, (b) constituting a packet, in which each checksum calculated in the step (a) is added to the encoded video bitstream data, and transmitting the packet through a wireless communication channel, and (c) receiving the packet of the encoded video bitstream data and checking whether there is an error in each partitioned unit of the encoded video bitstream data through the checksum of each partitioned unit of the encoded video bitstream data, by computers, are recorded.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENT

Figure 1:
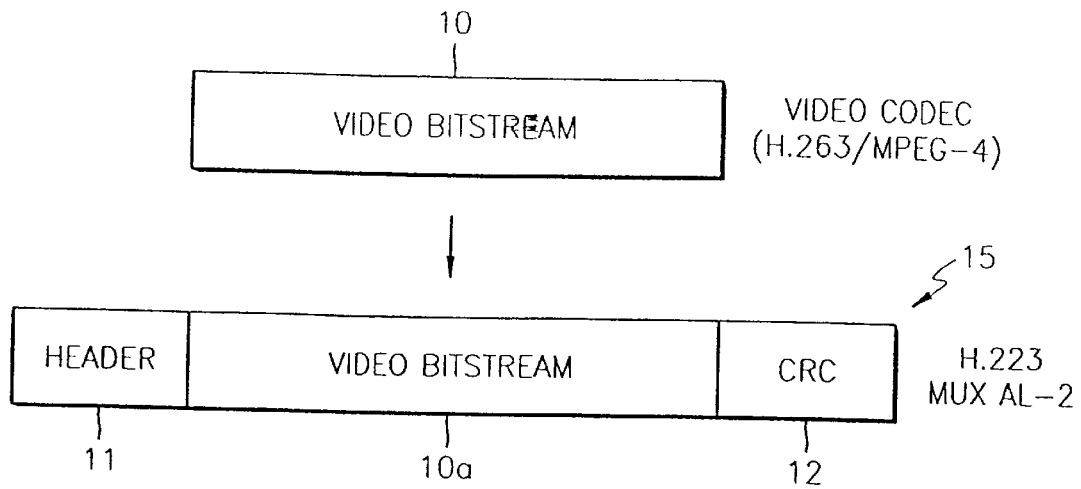
FIG. 1 schematically shows a multiplexing method for packetizing video bitstream data in the conventional H.223.
Figure 2:
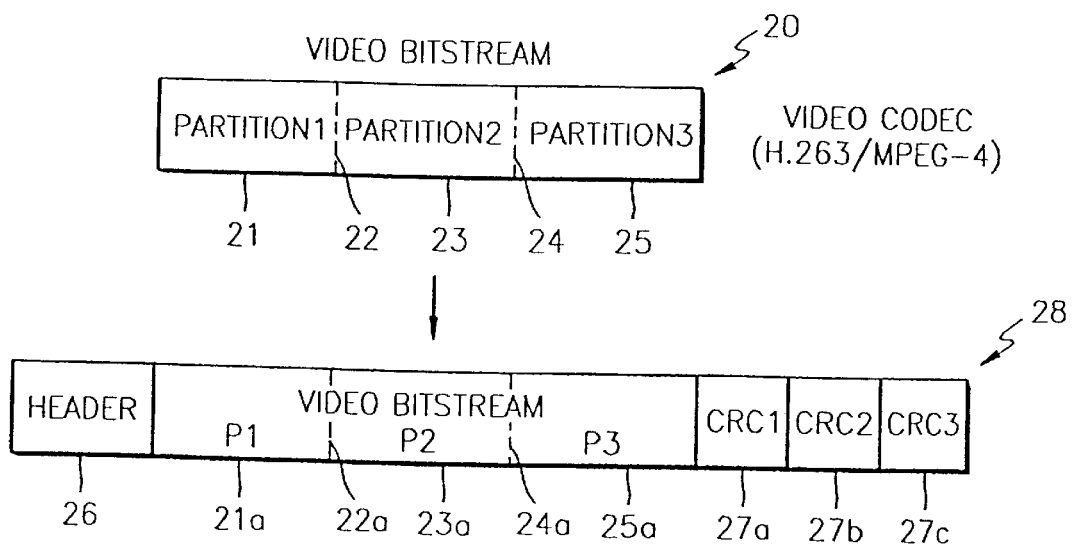
FIG. 2 schematically shows a multiplexing method for packetizing video bitstream data according to an embodiment of the present invention.

FIG. 2 schematically shows a multiplexing method for packetizing video bitstream data according to an embodiment of the present invention.

As shown in FIG. 2, the embodiment of the present invention is applied to a case where encoded video bitstream data is partitioned into data items, each having a specific characteristic. In the present embodiment, when video bitstream data 20 encoded according to a data partition mode of H.263 or MPEG-4 is received and multiplexed in the H.223 adaptation layer-2 (AL-2), a checksum, that is, a cyclic redundancy code (CRC) is calculated with respect to each partitioned region and the respective CRCs are inserted into a transmission packet. In the present embodiment, H.263 or MPEG-4 is taken as an example of a method for encoding video data and H-233 is taken as an example of a method for multiplexing multimedia data. However, the present invention is not restricted to this. Also, the CRC is taken as an example of the checksum. However, the present invention can also be applied to various checksum methods for controlling errors.

FIG. 2 shows a case where the video bitstream data 20 encoded in the H.263 or MPEG-4 data partition mode is constituted of three partition regions 21, 23, and 25. Here, the respective partition regions are separated from each other by predetermined markers 22 and 24. The input video bitstream data 20 is encapsulated or converged to a transmission packet, while maintaining respective partition regions 21a, 23a, and 25a and respective markers 22a and 24a. A header 26 and the CRCs 27a, 27b, and 27c corresponding to the respective partition regions are added to the video bitstream data 20 so as to constitute an entire transmission packet 28.

The length of a CRC field is 16 bits in the current H.223 AL-2. Therefore, in order to maintain compatibility with the conventional H.223, the entire CRC field in the present embodiment is preferably maintained to be 16 bits regardless of a specific partition method of a video codec, which can be applied to the present embodiment. In the case of a data partitioning slice mode used for the current H.263, since the video bitstream data is encoded to three partition regions, the bit length of the CRC of each of the three partition regions can be a combination of L, M, and N bits in the present embodiment, in consideration of the compatibility with the conventional H.223 (here, L, M, and N are positive integers and the sum of them is 16). For example, L, M, and N can be 4 bits, 4 bits, and 8 bits. In the case of the data partitioning mode of MPEG-4, since the video bitstream data is encoded to two independent regions, the bit length of the CRC of each of the two partition regions can be a combination of N and M bits in the present embodiment, in consideration of the compatibility with the conventional H.223 (here, N and M are positive integers and the sum of them is 16). For example, N and M can be 8 bits and 8 bits.

However, the combination of 4 bits, 4 bits, and 8 bits and the combination of 8 bit and 8 bits is exemplary. Anyone skilled in the art can modify the CRCs of the present invention by various combinations of bits according to the length of each partition region or the importance of each partition region. Also, anyone skilled in the art can select an appropriate polynomial operator p(x) for the CRC having a specific length. For example, in the case of the CRC of 4 bits, the operator p(x) obtained by Equation 1 can be used.

$$p(x)=x^4+x^2+x+1 \tag{1}$$

In the case of the CRC of 8 bits, the operator p(x) obtained by Equation 2 can be used.

$$p(x)=x^8+x^2+x+1 \tag{2}$$

The entire CRC obtained by sequentially combining the respective CRC fields with each other is preferably inserted into the location of the conventional CRC, in consideration of the compatibility with the conventional system. Namely, since the current CRC field is positioned at the end of a packet, it is preferable that the CRCs of the respective partition regions according to the present embodiment are sequentially combined with each other and that the combination result is added to the last field of the packet.

Figure 4:
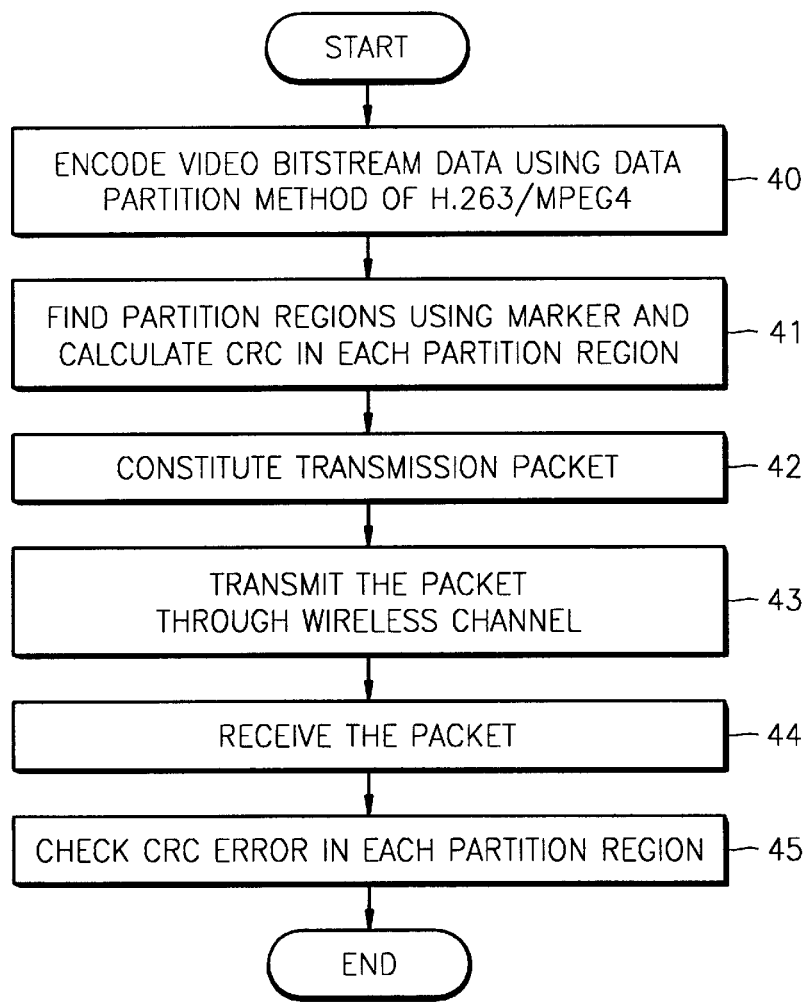
FIG. 4 is a flowchart describing an error control method for video bitstream data in wireless multimedia communication according to an embodiment of the present invention.

The error control method according to the present embodiment will be described with reference to FIG. 4. FIG. 4 is a flowchart describing an error control method for video bitstream data used in wireless multimedia communication according to an embodiment of the present invention.

When video bitstream data encoded according to the data partition method of H.263 or MPEG-4 is input (step 40), a CRC for controlling errors is independently calculated in each partition region (step 41).

Here, in order to calculate the CRC in each partition region, the boundary of each partition region must be able to be identified. Therefore, the respective partition regions are distinguished from each other by specific markers when the video bitstream data is encoded according to the data partition method in the step 40 and each partition region is identified by such a marker when the CRC of each partition region is calculated in the step 41.

A transmission packet is constituted by the method described in FIG. 2 (step 42). Here, as mentioned above, it is preferable that the CRCs of the respective partition regions for controlling errors are combined with each other and the combination result is added to the end of the packet.

The packet constituted as mentioned above is transmitted to the destination through the wireless channel and the transmitted packet is received at the destination (steps 43 and 44).

The packed received at the destination is demultiplexed for decoding and the CRC field of the received video bitstream is checked before the demultiplexed video bitstream is input to a decoder (step 45). Namely, when the CRC of the video bitstream calculated at the destination is equal to the value of the received CRC field, it is determined that there is no error in the received data and a decoding process is performed. However, when the CRC of the video bitstream calculated at the destination is not equal to the value of the received CRC field, it is determined that a transmission error exists and the corresponding video bitstream is abandoned or a portion which can be decoded is separately used.

Since the transmission data is encoded using the data partition technique in the present embodiment, the CRC of each partition region can be more effectively used. Namely, when it is determined that errors occur only in a specific portion of a video bitstream by checking the CRC of each partition region, the entire video bitstream is not abandoned and data of a portion in which errors do not occur can be used.

In general, when the data partition technique is used, decoding can be performed only when the markers for distinguishing the respective partition regions from each other are error-free. Namely, when errors exist in the markers even when there is no error in each partition region, that is, when the markers cannot be found, the partition region in which errors do not exist cannot be used. However, such a problem can be solved in the present embodiment where not the CRC of the entire video data but the CRC of part of the video data is calculated. A method for solving the problem caused by errors of the markers in the present embodiment will be described.

Figure 3:
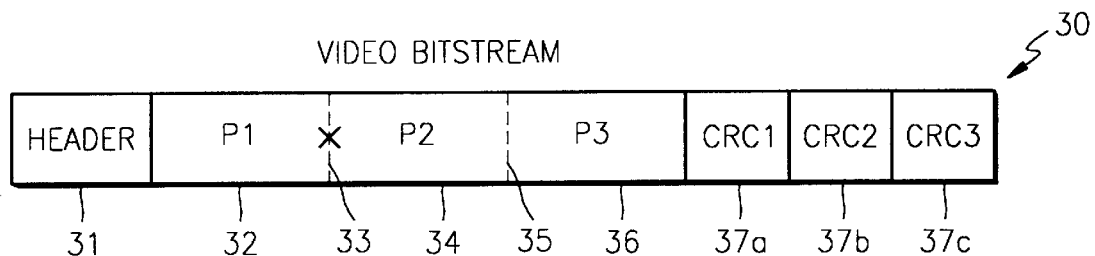
FIG. 3 shows a case where an error occurs in a marker used for classifying data partition regions in a video bitstream encoded according to a data partition technique.

FIG. 3 shows a case where an error occurs in the marker used for distinguishing the data partition regions from each other in the video bitstream encoded according to the data partition technique. FIG. 3 shows a case where errors do not exist in respective partition regions 32, 34, and 36 of a video bitstream 30 and where an error occurs in a marker 33 used for distinguishing the partition regions from each other. For the convenience of explanation, it is assumed that errors do not exist in a header 31 and CRCs 37a, 37b, and 37c.

In general, all of the video bitstream data cannot be used when the marker is not detected when decoding is performed from the beginning to certain part. However, since the CRC is calculated in each partition region in the present embodiment, when the specific marker 33 is not found, a corresponding partition region is sequentially decoded and the CRC of the corresponding partition region is calculated. When the CRC of the corresponding partition region is equal to the value of a corresponding CRC field, decoding of a corresponding partition region is stopped and the bitstream is proceeded by the length of the marker and then, the bitstream of the next partition region is decoded. Therefore, according to the present invention, it is possible to prevent a case where the entire video bitstream cannot be decoded simply because errors exist in the marker.

According to the present invention, it is possible to effectively detect the errors of the respective partitioned video bitstream data items and to use partial data without abandoning the entire video bitstream packet when errors occur in a specific portion of the video bitstream data by calculating the CRCs of the respective partition regions of the video bitstream data encoded according to a data partition technique. Therefore, according to the present invention, it is possible to more effectively transmit the video bitstream data. Also, it is possible to prevent a case where the entire bitstream cannot be decoded simply because errors exist in the marker.

The above-identified invention may be embodied in a computer program product, as will now be explained.

On a practical level, the software that enables the computer system to perform the operations described further below in detail, may be supplied on any one of a variety of media. Furthermore, the actual implementation of the approach and operations of the invention are actually statements written in a programming language. Such programming language statements, when executed by a computer, cause the computer to act in accordance with the particular content of the statements. Furthermore, the software that enables a computer system to act in accordance with the invention may be provided in any number of forms including, but not limited to, original source code, assembly code, object code, machine language, compressed or encrypted versions of the foregoing, and any and all equivalents.

One of skill in the art will appreciate that "media", or "computer-readable media", as used here, may include a diskette, a tape, a compact disc, an integrated circuit, a ROM, a CD, a DVD, a cartridge, a remote transmission via a communications circuit, carrier waves such as transmission through the Internet, or any other similar medium useable by computers. For example, to supply software for enabling a computer system to operate in accordance with the invention, the supplier might provide a diskette or might transmit the software in some form via satellite transmission, via a direct telephone link, or via the Internet. Thus, the term, "computer readable medium" is intended to include all of the foregoing and any other medium by which software may be provided to a computer.

Although the enabling software might be "written on" a diskette, "stored in" an integrated circuit, or "carried over" a communications circuit, it will be appreciated that, for the purposes of this application, the computer usable medium will be referred to as "bearing" the software. Thus, the term "bearing" is intended to encompass the above and all equivalent ways in which software is associated with a computer usable medium.

For the sake of simplicity, therefore, the term "program product" is thus used to refer to a computer useable medium, as defined above, which bears in any form software to enable a computer system to operate according to the above-identified invention.

Thus, the invention is also embodied in a program product bearing software which enables a computer to perform an error control method for video bitstream data, according to the invention.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An error control method for video bitstream data used in wireless communication, comprising the steps of:

(a) partitioning video bitstream data into units of information items having certain characteristics and encoding the video bitstream data;

(b) calculating a checksum of each partitioned unit of the encoded video bitstream data for controlling errors in each partitioned unit of the encoded video bitstream data;

(c) constituting a packet, in which each checksum calculated in the step (b) is added to the encoded video bitstream data and transmitting the packet through a wireless communication channel; and (d) receiving the packet transmitted in the step (c) and checking whether there is an error in each partitioned unit of the encoded video bitstream data through the checksum of each partitioned unit of the encoded video bitstream data.

2. The method of claim 1, wherein the video bitstream data is partitioned into two regions and encoded in the step (a), and wherein checksums for controlling errors of the two partitioned regions of the encoded video bitstream data are calculated by N bits and M bits when N and M are predetermined first and second positive integers and the sum of N and M is 16 in the step (b).

3. The method of claim 2, wherein each of the checksums for controlling errors of the two partitioned regions of the encoded video bitstream data is calculated by 8 bits in the step (b).

4. The method of claim 1, wherein the video bitstream data is partitioned into three regions and encoded in the step (a), and wherein checksums for controlling errors of the three partitioned regions of the encoded video bitstream data are calculated by L bits, M bits, and N bits, wherein L, M, and N are predetermined first, second, and third positive integers, and the sum of L, M and N is 16 in the step (b).

5. The method of claim 4, wherein the checksums for controlling errors of the three partitioned regions of the encoded video bitstream data are calculated by 4 bits, 4 bits, and 8 bits in the step (b).

6. The method of claim 1, wherein the partitioned units of the encoded video bitstream data are distinguished from each other by a predetermined marker in the step (a), and wherein each partitioned unit of the encoded video bitstream data is found using the marker in order to calculate a checksum for controlling errors of each partitioned unit of the encoded video bitstream data in the step (b).

7. A method for constituting a packet for controlling errors of a video bitstream data used in wireless communication, comprising the steps of:

(a) receiving video bitstream data, which is partitioned into units of information items having certain characteristics and encoded;

(b) calculating a checksum of each partitioned unit of the encoded video bitstream data for controlling errors in each partitioned unit of the encoded video bitstream data; and (c) constituting a packet by adding each checksum calculated in the step (b) to the encoded video bitstream data.

8. The method of claim 7, wherein the checksums are sequentially combined with each other in the order of the partitioned units of the encoded video bitstream data and the combination result is added to the encoded video bitstream data in the step (c).

9. The method of claim 8, wherein the sequentially combined checksum is positioned in a last field of the packet in the step (c).

10. An error control method of video bitstream data in wireless communication using a packet constituted by adding a checksum for controlling errors to each partitioned unit of video bitstream data, which is partitioned into units of information items having certain characteristics and encoded, comprising the steps of:

(a) receiving the packet; and (b) checking whether errors exist in each partitioned unit of the encoded video bitstream data by calculating the checksum of each partitioned unit of the encoded video bitstream data.

11. The method of claim 10, wherein a packet, in which the partitioned units of the encoded video bitstream data are distinguished from each other by a predetermined marker, is received in the step (a), and wherein, the partitioned units of the video bitstream data of the received packet are found through the marker and, in a case where a specific marker cannot be found, the checksum of corresponding partitioning region is sequentially calculated and the bitstream is proceeded by the length of the marker when the checksum of the corresponding partitioned region is equal to a value of a corresponding checksum field, and then it is checked whether there are errors in the next partitioned region, in the step (b).

12. A computer program product for enabling a computer to perform constituting a packet for controlling errors of a video bitstream data used in wireless communication, comprising:

software instructions for enabling the computer to perform predetermined operations, and a computer readable medium bearing the software instructions;

the predetermined operations including the steps of:

(a) receiving video bitstream data, which is partitioned into units of information items having certain characteristics and encoded, and calculating a checksum of each partitioned unit of the encoded video bitstream data for controlling errors in each partitioned unit of the encoded video bitstream data; and (b) constituting a packet by adding each checksum calculated in the step (a) to the encoded video bitstream data.

13. A computer program product for enabling a computer to control errors of video bitstream data using a packet constituted by adding a checksum for controlling errors to each partitioned unit of video bitstream data, which is partitioned into units of information items having certain characteristics and encoded, comprising:

software instructions for enabling the computer to perform predetermined operations, and a computer readable medium bearing the software instructions;

the predetermined operations including the steps of:

(a) receiving the packet; and (b) checking whether there are errors in each partitioned unit of the encoded video bitstream data by calculating the checksum of each partitioned unit of the encoded video bitstream data.

14. A computer program product for enabling a computer to perform error control for video bitstream data used in wireless communication, comprising:

software instructions for enabling the computer to perform predetermined operations, and a computer readable medium bearing the software instructions;

the predetermined operations including the steps of:

(a) receiving video bitstream data, which is partitioned into units of information items having certain characteristics and encoded, and calculating a checksum of each partitioned unit of the encoded video bitstream data for controlling errors in each partitioned unit of the encoded video bitstream data;

(b) constituting a packet, in which each checksum calculated in the step (a) is added to the encoded video bitstream data, and transmitting the packet through a wireless communication channel; and (c) receiving the packet of the encoded video bitstream data and checking whether there is an error in each partitioned unit of the encoded video bitstream data through the checksum of each partitioned unit of the encoded video bitstream data.

* * * * *